United States Patent
Kawano et al.

(10) Patent No.: US 9,871,072 B2
(45) Date of Patent: Jan. 16, 2018

(54) PHOTOELECTRIC CONVERSION DEVICE, IMAGE PICKUP SYSTEM, AND METHOD FOR MANUFACTURING PHOTOELECTRIC CONVERSION DEVICE

(71) Applicant: CANON KABUSHIKI KAISHA, Tokyo (JP)

(72) Inventors: Akihiro Kawano, Yokohama (JP); Yukinobu Suzuki, Koza-gun (JP); Nobutaka Ukigaya, Yokohama (JP); Takayasu Kanesada, Yamato (JP); Takeshi Aoki, Oita (JP); Hiroshi Takakusagi, Atsugi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/165,957

(22) Filed: May 26, 2016

(65) Prior Publication Data

US 2016/0353044 A1  Dec. 1, 2016

(30) Foreign Application Priority Data

May 29, 2015  (JP) ................... 2015-109425

(51) Int. Cl.
*H01L 27/146* (2006.01)
*H04N 5/369* (2011.01)

(52) U.S. Cl.
CPC .... *H01L 27/14632* (2013.01); *H01L 27/1462* (2013.01); *H01L 27/14609* (2013.01);
(Continued)

(58) Field of Classification Search
CPC .......... H04N 5/369; H04N 5/3745; H01L 27/146–27/14656; H01L 27/14685; H01L 27/14687; H01L 27/14689
See application file for complete search history.

(56) References Cited

U.S. PATENT DOCUMENTS

| | | | |
|---|---|---|---|
| 9,401,388 B2* | 7/2016 | Sato | ...... H01L 27/307 |
| 2010/0301444 A1* | 12/2010 | Koike | ...... H01L 27/14687 |
| | | | 257/443 |
| 2015/0221694 A1* | 8/2015 | Baba | ...... H01L 27/14634 |
| | | | 257/443 |

FOREIGN PATENT DOCUMENTS

| | | | |
|---|---|---|---|
| JP | 7-086255 A | 3/1995 | |
| JP | 8-293549 A | 11/1996 | |

(Continued)

*Primary Examiner* — Lin Ye
*Assistant Examiner* — Chriss Yoder, III
(74) *Attorney, Agent, or Firm* — Canon U.S.A. Inc., IP Division

(57) ABSTRACT

A photoelectric conversion device has an insulator film disposed on a silicon layer having a photoelectric conversion region, the insulator film having a portion overlapped with the photoelectric conversion region, a silicon oxide film disposed on the insulator film, the silicon oxide film having a portion overlapped with the photoelectric conversion region, an electroconductive member disposed between the insulator film and the silicon oxide film, and a silicon oxide layer disposed between the electroconductive member and the silicon oxide film, in which the portion overlapped with the photoelectric conversion region of the silicon oxide film is in contact with the portion overlapped with the photoelectric conversion region of the insulator film and the hydrogen concentration of the silicon oxide film is greater than the hydrogen concentration of the silicon oxide layer.

14 Claims, 6 Drawing Sheets

(52) U.S. Cl.
CPC .. *H01L 27/14636* (2013.01); *H01L 27/14643* (2013.01); *H01L 27/14685* (2013.01); *H01L 27/14687* (2013.01); *H01L 27/14689* (2013.01); *H04N 5/369* (2013.01)

(56) References Cited

FOREIGN PATENT DOCUMENTS

| | | | |
|---|---|---|---|
| JP | 2004-80045 | A | 3/2004 |
| JP | 2006-086500 | A | 3/2006 |
| JP | 2008-172056 | A | 7/2008 |

\* cited by examiner

PHOTOELECTRIC CONVERSION DEVICE, IMAGE PICKUP SYSTEM, AND METHOD FOR MANUFACTURING PHOTOELECTRIC CONVERSION DEVICE

BACKGROUND OF THE INVENTION

Field of the Invention

The present technique relates to the structure around an electroconductive member in a photoelectric conversion device.

Description of the Related Art

In the photoelectric conversion device, while miniaturization of wiring has been demanded as in semiconductor devices, such as arithmetic operation devices and memory devices, a reduction in noise adversely affecting the photographed image quality has also been demanded.

In the miniaturization of wiring, Japanese Patent Laid-Open No. 2004-80045 describes patterning a metal film using a hard mask containing a PE-TEOS film.

Japanese Patent Laid-Open No. 2004-80045 does not examine insulator films, such as interlayer insulation films covering wiring. In general, silicon oxide films are used for the interlayer insulation film. However, when applied to the photoelectric conversion device, noises are likely to be generated depending on the characteristics of the interlayer insulation films.

Then, the present technique aims at providing a photoelectric conversion device with reduced noise.

SUMMARY OF THE INVENTION

In order to improve upon the above-described related art, a photoelectric conversion device has an insulator film disposed on a silicon layer having a photoelectric conversion portion in such a manner as to have a portion overlapped with the photoelectric conversion portion, a silicon oxide film disposed on the insulator film in such a manner as to have a portion overlapped with the photoelectric conversion portion, wiring disposed between the insulator film and the silicon oxide film, and a silicon oxide layer disposed between the wiring and the silicon oxide film, in which the portion overlapped with the photoelectric conversion portion of the silicon oxide film is in contact with the portion overlapped with the photoelectric conversion portion of the insulator film and the hydrogen concentration of the silicon oxide film is greater than the hydrogen concentration of the silicon oxide layer.

Moreover, in order to improve upon the above-described related art, a photoelectric conversion device has a first insulator film disposed on a silicon layer having a photoelectric conversion portion in such a manner as to have a portion overlapped with the photoelectric conversion portion, a silicon oxide film disposed on the first insulator film in such a manner as to have a portion overlapped with the photoelectric conversion portion, wiring disposed between the first insulator film and the silicon oxide film, a silicon oxide layer disposed between the wiring and the silicon oxide film, and a second insulator film disposed on the silicon oxide film in such a manner as to have a portion overlapped with the photoelectric conversion portion and containing hydrogen, in which the portion overlapped with the photoelectric conversion portion of the silicon oxide film is in contact with the portion overlapped with the photoelectric conversion portion of the first insulator film and the portion overlapped with the photoelectric conversion portion of the second insulator film and the density of the silicon oxide film is greater than the density of the silicon oxide layer.

In order to improve upon the above-described related art, a method for manufacturing a photoelectric conversion device includes a process of forming a conductor film on an insulator film disposed on a silicon layer having a photoelectric conversion portion, a process of forming a first silicon oxide film on the conductor film by a plasma CVD method, a process of forming a mask pattern from the first silicon oxide film by patterning the first silicon oxide film, a process of forming wiring from the conductor film by patterning the conductor film using the mask pattern, a process of forming a second silicon oxide film so that the second silicon oxide film covers the wiring and the mask pattern by a plasma CVD method, and a process of forming an insulator film on the second silicon oxide film, in which the plasma density in the film formation of the second silicon oxide film is greater than the plasma density in the film formation of the first silicon oxide film.

Further features of the present invention will become apparent from the following description of exemplary embodiments with reference to the attached drawings.

DESCRIPTION OF THE EMBODIMENTS

Figure 1A:
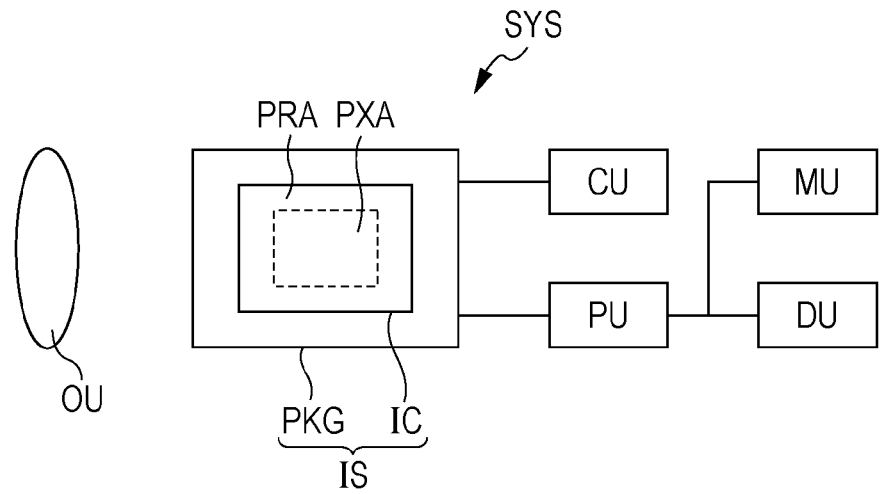
FIGS. 1A and 1B are schematic views explaining an example of a photoelectric conversion device.

Hereinafter, embodiments for carrying out the present technique are described with reference to the drawings. In the following description and the drawings, the common configurations among the plurality of drawings are designated by the common reference numerals. Therefore, the common configurations are described mutually referring to the plurality of drawings and descriptions of the configurations designated by the common reference numerals are omitted as appropriate.

Photoelectric Conversion Device

First, the outline of a photoelectric conversion device IS is described with reference to FIG. 1A. The photoelectric conversion device IS contains a photoelectric conversion device IC configuring the entire photoelectric conversion device IS or a part thereof. The photoelectric conversion device IC is a semiconductor device having an integrated circuit. The photoelectric conversion device is a semiconductor device. The semiconductor device can be a semiconductor chip obtained by dicing a semiconductor wafer. The photoelectric conversion device can have a pixel circuit area PXA and a peripheral circuit area PRA on a substrate. In the pixel circuit area PXA, a plurality of pixel circuits are disposed. In the peripheral area PRA, peripheral circuits, such as a drive circuit and a signal processing circuit, are disposed. The photoelectric conversion device IS can further have a package PKG accommodating the photoelectric conversion device IC. An image pickup system SYS can be constructed using the photoelectric conversion device IS. The image pickup system SYS is an information terminal having a camera and a photographing function. The image pickup system SYS can have an optical unit OU forming an image on the photoelectric conversion device IS. The image pickup system SYS can at least have any one of a control unit CU, a processing unit PU, a display unit DU, and a memory unit MU. The control unit CU controls the photoelectric conversion device IS, the processing unit PU processes a signal obtained from the photoelectric conversion device IS, the display unit DU displays an image obtained from the photoelectric conversion device IS, and the memory unit MU stores the image obtained from the photoelectric conversion device IS.

Figure 1B:
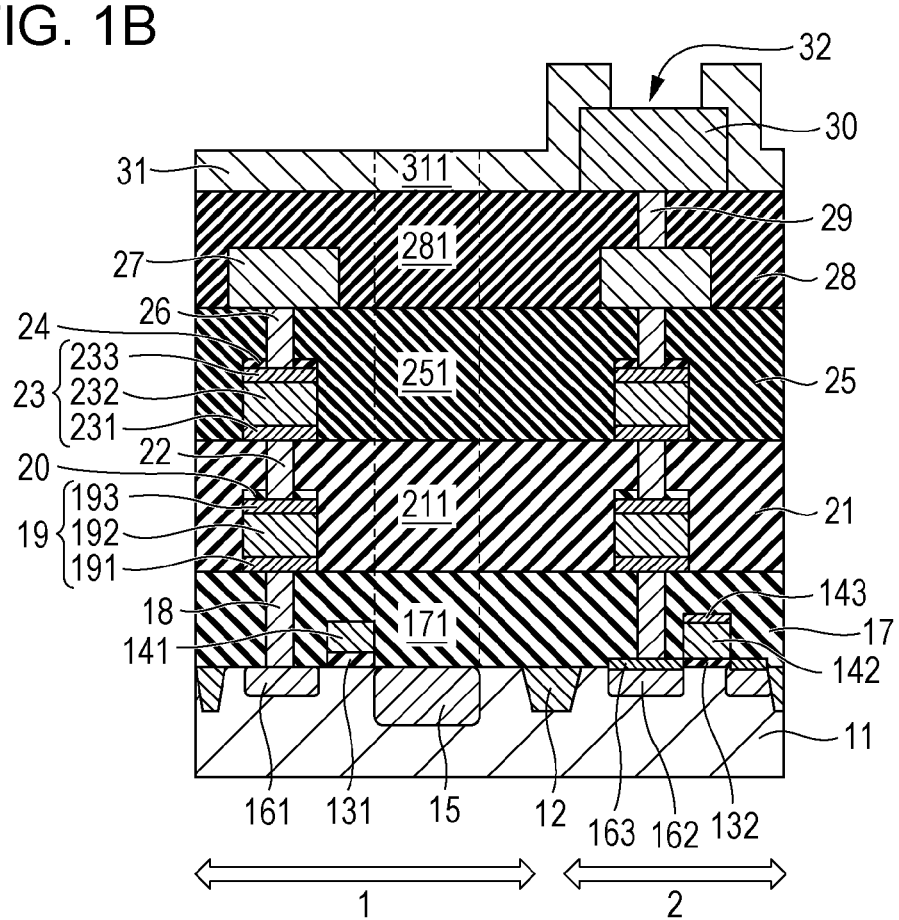

FIG. 1B is a cross-sectional schematic view of the photoelectric conversion device IC of the photoelectric conversion device IS, in which a part of the pixel circuit area PXA of FIG. 1A is illustrated as a pixel portion 1 and a part of the peripheral circuit area PRA is illustrated as a peripheral portion 2.

In the following description, a silicon oxide is a compound containing silicon (Si) and oxygen (O) as constituent elements and refers to one in which the atomic percentage of oxygen is the highest among elements other than silicon and hydrogen. The silicon oxide can contain at least one element of elements having an atomic percentage less than that of oxygen, such as boron, carbon, nitrogen, fluorine, phosphorus, and chlorine, other than silicon and oxygen. Silicate glass, such as boro-phospho silicate glass (BPSG), is also one kind of the silicon oxide. Similarly, silicon nitride is a compound containing silicon (Si) and nitrogen (N) and refers to one in which the atomic percentage of nitrogen is the highest among elements other than silicon and hydrogen. The silicon nitride can contain at least one element of elements having an atomic percentage less than that of nitrogen, such as boron, carbon, oxygen, fluorine, phosphorus, and chlorine other than silicon and nitrogen. Silicon oxynitride is the silicon oxide or the silicon nitride in the definition described above and is a silicon compound containing both oxygen and nitrogen. Various kinds of compounds can contain an arbitrary amount of hydrogen. This hydrogen is sometimes bonded to silicon (Si—H bond) or is sometimes bonded to oxygen (O—H bond) in the silicon oxide. Or, this hydrogen is sometimes bonded to nitrogen and carbon (N—H bond, C—H bond) which are additionally contained in the silicon oxide. Similarly, this hydrogen is sometimes bonded to silicon (Si—H bond) or is sometimes bonded to nitrogen (N—H bond) in the silicon nitride. Or, this hydrogen is sometimes bonded to oxygen and carbon (O—H bond, C—H bond) which are additionally contained in the silicon nitride. The same applies to substances other than oxides and nitrides and the same applies to metal compounds other than silicon compounds.

As illustrated in FIG. 1B, element isolation portions 12 which define element portions and contain insulators, such as STI and LOCOS, are disposed in a silicon layer 11 which is a semiconductor substrate.

In the pixel portion 1, a gate electrode 141 having a polysilicon layer is disposed on the silicon layer 11 through a gate insulating film 131. In the silicon layer 11, a photoelectric conversion region 15 configuring a photodiode and an impurity region 161 configuring a floating node are individually disposed. The gate electrode 141 configures a MOS type transfer gate which transfers electric carriers of the photoelectric conversion region 15 to the impurity region 161. In the pixel portion 1, an amplification transistor (not illustrated) having a gate connected to the impurity region 161 and a reset transistor (not illustrated) having a source/drain region connected to the impurity region 161 are also provided.

In the peripheral portion 2, a gate electrode 142 having a polysilicon layer and a silicide layer 143 is disposed on the silicon layer 11 through a gate insulating film 132. Moreover, a source/drain region 162 is disposed in the silicon layer 11 and a silicide layer 163 is disposed on the source/drain region 162. A transistor having the gate electrode 142 and the source/drain region 162 can configure a CMOS circuit.

In this example, the thickness of the gate insulating film 132 in the peripheral portion 2 is smaller than that of the gate insulating film 131 in the pixel portion 1. Although the gate electrode 141 in the pixel portion 1 has no silicide layer, the gate electrode 142 in the peripheral portion 2 has the silicide layer 143.

An insulator film 17 is disposed on the silicon layer 11. In the insulator film 17, contact plugs 18 electrically connected to the impurity region 161 and the source/drain region 162 are embedded. The insulator film 17 has an overlapped portion 171 which is a portion overlapped with the photoelectric conversion region 15. Between the overlapped portion 171 and the photoelectric conversion region 15, an antireflection film (not illustrated) can be provided. Between the insulator film 17 and the silicon layer 11, an etching stop film (not illustrated) to be used when forming a contact hole in the insulator film 17 can also be provided. Between the insulator film 17 and the silicon layer 11, a silicide block film to be used in a salicide process of forming the silicide layers 143 and 163 can also be provided. One film may have a plurality of functions of layers among the antireflection film, the etching stop film, and the silicide block film mentioned above.

On the insulator film 17, electroconductive members 19 connected to the contact plugs 18 are disposed. The electroconductive member 19 can function as a wiring member. The insulator film 17 can function as an interlayer insulation film between the electroconductive member 19 and the silicon layer 11. The electroconductive members 19 each can have a barrier metal portion 191, an electroconductive portion 192, and a barrier metal portion 193. The barrier metal portions 191 and 193 suppress diffusion between the electroconductive portion 192 and the peripheral members. The electroconductive portion 192 is configured by an aluminum layer containing aluminum as the main component. The aluminum layer contains aluminum alone or an aluminum alloy. As the aluminum alloy, an alloy of aluminum and copper (AlCu) and an alloy of aluminum and silicon (AlSi) are typically mentioned. Each of the barrier metal portion 191 and the barrier metal portion 193 is configured by a titanium layer and/or a titanium nitride layer, for example. For example, the electroconductive members 19 each have a lamination structure of a titanium layer, a titanium nitride layer, an aluminum layer, a titanium layer, and a titanium nitride layer in order from the insulator film 17 side. The thickness of each layer can be set as follows: Titanium layer of Barrier metal portion 193<Titanium layer of Barrier metal portion 191<Titanium nitride layer of Barrier metal portion 191<Titanium nitride layer of Barrier metal portion 193<Aluminum layer of Electroconductive portion 192, for example. The top surface of each of the electroconductive members 19 is configured by the barrier metal portion 193 and can be configured by a titanium nitride layer, for example. The side surface of each of the electroconductive members 19 is mainly configured by the electroconductive portion 192 and can be configured by an aluminum layer, for example.

On the top surface of each of the electroconductive members 19, a silicon oxide layer 20 is disposed. The silicon oxide layer 20 can contact the top surface of the electroconductive member 19. For example, the silicon oxide layer 20 can contact the titanium nitride layer of the barrier metal portion 193 of the electroconductive member 19. The silicon oxide layer 20 has the same width as the width of the electroconductive member 19 and is not in contact with the side surface of the electroconductive member 19. For example, the silicon oxide layer 20 does not contact the aluminum layer of the electroconductive portion 192 of the electroconductive member 19. The silicon oxide layer 20 can be a left portion of a silicon oxide layer used as a mask in dry etching when the electroconductive member 19 is patterned. The silicon oxide layer 20 can function as a diffusion prevention layer for elements contained in the electroconductive member 19.

On the electroconductive members 19 and the insulator film 17, an insulator film 21 is disposed. The electroconductive members 19 are located between the insulator film 17 and the insulator film 21. The silicon oxide layer 20 is located between the electroconductive member 19 and the insulator film 21. In the insulator film 21 and the silicon oxide layer 20, through holes which reach the electroconductive members 19 are formed. In the through holes, via plugs 22 electrically connected to the electroconductive members 19 are embedded. The insulator film 21 has an overlapped portion 211 which is a portion overlapped with the photoelectric conversion region 15. The overlapped portion 211 can contact the overlapped portion 171.

On the insulator film 21, electroconductive members 23 connected to the electroconductive members 19 through the via plugs 22 are disposed. The electroconductive member 23 can function as a wiring member. The insulator film 21 can function as an interlayer insulation film between the electroconductive member 19 and the electroconductive member 23. The electroconductive members 23 each can have a barrier metal portion 231, an electroconductive portion 232, and a barrier metal portion 233. Since the layer configuration of the electroconductive members 23 can be the same as that of the electroconductive members 19, the description is omitted.

On the top surface of each of the electroconductive members 23, a silicon oxide layer 24 is disposed. The silicon oxide layer 24 can contact the top surface of the electroconductive member 23. For example, the silicon oxide layer 24 can contact the titanium nitride layer of the barrier metal portion 233 of the electroconductive member 23. The silicon oxide layer 24 has the same width as the width of the electroconductive member 23 and is not in contact with the side surface of the electroconductive member 23. For example, the silicon oxide layer 24 does not contact the aluminum layer of the electroconductive portion 232 of the electroconductive member 23. The silicon oxide layer 24 can be a left portion of a silicon oxide layer used as a mask in dry etching when the electroconductive member 23 is patterned. The silicon oxide layer 24 can function as a diffusion prevention layer for elements contained in the electroconductive member 23.

On the electroconductive members 23 and the insulator film 21, an insulator film 25 is disposed. The electroconductive members 23 are located between the insulator film 21 and the insulator film 25. The silicon oxide layer 24 is located between the electroconductive member 23 and the insulator film 25. In the insulator film 25 and the silicon oxide layer 24, through holes which reach the electroconductive members 23 are formed. In the through holes, via plugs 26 electrically connected to the electroconductive members 23 are embedded. The insulator film 25 has an overlapped portion 251 which is a portion overlapped with the photoelectric conversion region 15. The overlapped portion 251 can contact the overlapped portion 211.

On the insulator film 25, electroconductive members 27 connected to the electroconductive member 23 through the via plugs 26 are disposed. The electroconductive member 27 may have a grid pattern having a plurality of openings in the pixel portion 1. The electroconductive member 27 in that case can function as a light shielding member. The electroconductive member 27 can function as a wiring member in the peripheral portion 2. The insulator film 25 can function as an interlayer insulation film between the electroconductive members 23 and the electroconductive members 27. The electroconductive members 27 each have an electroconductive portion configured by an aluminum layer containing aluminum as the main component. The electroconductive members 27 each may have a barrier metal portion as in the electroconductive members 19 and 23.

On the electroconductive members 27 and the insulator film 25, an insulator film 28 is disposed. In the insulator film 28, a through hole which reaches the electroconductive member 27 is formed. In this through hole, a via plug 29 electrically connected to the electroconductive member 27 is embedded. The insulator film 28 has an overlapped portion 281 which is a portion overlapped with the photoelectric conversion region 15. The overlapped portion 281 can contact the overlapped portion 251.

On the insulator film 28, an electroconductive member 30 connected to the electroconductive member 27 through the via plug 29 is disposed. In the peripheral portion 2, the electroconductive member 30 can function as a bonding pad which wire to be used in a wire bonding method, a bump to be used in a flip-chip-bonding method, or the like contacts. The electroconductive member 30 can function as a wiring member in the peripheral portion 2. The insulator film 28 can function as an interlayer insulation film between the electroconductive members 27 and the electroconductive member 30. The electroconductive member 30 has an electroconductive portion configured by an aluminum layer containing aluminum as the main component. The electroconductive member 30 may have a barrier metal portion as in the electroconductive members 19 and 23. The barrier metal of the electroconductive member 30 does not need to contain a titanium layer.

On the electroconductive member 30 and the insulator film 28, a dielectric film 31 is disposed. The dielectric film 31 functions as a passivation film or a protective film and is configured by a single layer film or a multilayer film containing a silicon nitride layer, a silicon oxynitride layer, and a silicon oxide layer. The dielectric film 31 can also form a lens portion in such a manner that an overlapped portion 311 overlapped with the photoelectric conversion region 15 configures an interlayer lens or the like. The dielectric film 31 has an opening 32 for bonding on the electroconductive member 30 which functions as a bonding pad.

On the dielectric film 31, a color filter and a microlens (not illustrated) can be provided. The color filter and the microlens can be disposed on a side opposite to the electroconductive members 19, 23, 27, and 30 with respect to the silicon layer 11 to configure a so-called back side illumination type photoelectric conversion device. The thickness of the silicon layer 11 in that case is set to be about 1 to 10 µm.

The insulator films 17, 21, 25, and 28 can be silicon oxide films. Hereinafter, each of the insulator films 17, 21, 25, and 28 can be a single layer film of a silicon oxide layer having uniform characteristics or can be a multilayer film of a plurality of silicon oxide layers having different characteristics. Each of the insulator film 17, 21, 25, and 28 can contain hydrogen.

There is the following relationship between the insulator film 21 in which the overlapped portion 211 is located between the electroconductive members 19 and the silicon oxide layers 20 located between the insulator film 21 and the electroconductive members 19.

The hydrogen concentration of the insulator film 21 is preferably greater than the hydrogen concentration of the silicon oxide layers 20. This means that, when the insulator film 21 is configured by a plurality of silicon oxide layers, the hydrogen concentration of all the silicon oxide layers of the insulator film 21 is greater than the hydrogen concentration of the silicon oxide layers 20. The hydrogen concentration of the insulator film 21 is represented by the hydrogen concentration in the overlapped portion 211.

The comparison between the hydrogen concentrations can be evaluated by the ratio of the number of the Si—OH bonds to the number of the Si—O bonds (Number of Si—OH bonds/Number of Si—O bonds) in the silicon oxides. The ratio of the number of Si—OH bonds to the Si—O bonds (Number of Si—OH bonds/Number of Si—O bonds) in the insulator film 21 is 1/70 to 1/50, for example. The ratio of the number of Si—OH bonds to the Si—O bonds (Number of Si—OH bonds/Number of Si—O bonds) in the silicon oxide layer 20 is 1/120 to 1/100, for example.

Due to the fact that the hydrogen concentration in the insulator film 21 is greater than the hydrogen concentration of the silicon oxide layer 20, the insulator film 21 can act as an effective hydrogen supply member. The overlapped portions 171 and 211 can be portions closest to the photoelectric conversion region 15 of the insulator films 17 and 21. Therefore, due to the fact that the overlapped portion 211 of the insulator film 21 contacts the overlapped portion 171 located under the overlapped portion 211, abundant hydrogen contained in the overlapped portion 211 can be appropriately supplied to the photoelectric conversion region 15 through the overlapped portion 171.

The density of the insulator film 21 is preferably less than the density of the silicon oxide layer 20. The fact that the density of the insulator film 21 is less than the density of the silicon oxide layer 20 means that the density of all the silicon oxide layers of the insulator film 21 is greater than the density of the silicon oxide layer 20. For example, the density of the insulator film 21 is 2.180 to 2.190 g/cm$^3$. The density of the silicon oxide layer 20 is 2.190 to 2.200 g/cm$^3$.

Due to the fact that the density of the insulator film 21 is less than the silicon oxide layer 20, the insulator film 21 can effectively act as a hydrogen transmission member. The overlapped portions 171, 211, and 251 can be portions closest to the photoelectric conversion region 15 of the insulator films 17, 21, and 25. Therefore, due to the fact that the overlapped portion 211 of the insulator film 21 contacts the overlapped portion 251 and the overlapped portion 171 located on and under the overlapped portion 211, respectively, hydrogen of the overlapped portion 251 easily transmits through the overlapped portion 211 to be appropriately supplied to the photoelectric conversion region 15 through the overlapped portion 171. Due to the fact that the density of the silicon oxide layer 20 is greater than the density of the insulator film 21, the silicon oxide layer 20 can function as a member which more easily shields hydrogen than the insulator film 21. Therefore, the silicon oxide layer 20 can suppress the occlusion of the hydrogen present around the electroconductive members 19 into the titanium layer of the barrier metal portions 233 of the electroconductive members 19.

Similarly, there is the following relationship between the insulator film 25 in which the overlapped portion 251 is located between the electroconductive members 23 and the silicon oxide layers 24 located between the insulator film 25 and the electroconductive members 23. The hydrogen concentration of the insulator film 25 is preferably greater than the hydrogen concentration of the silicon oxide layers 24. The density of the insulator film 25 is preferably less than the density of the silicon oxide layers 24.

The hydrogen concentration of the insulator film 28 may be less than the hydrogen concentration of the insulator film 25 but is preferably the same as or greater than the hydrogen concentration of the insulator film 25. Therefore, it can be said that the hydrogen concentration of the insulator film 28 is preferably greater than the hydrogen concentration of the silicon oxide layer 24. Thus, hydrogen can be supplied to the insulator film 25 from the insulator film 28.

The hydrogen concentration of each of the insulator films 21, 25, and 28 is preferably greater than the hydrogen concentration of the insulator film 17. Thus, even when a member which blocks the diffusion of hydrogen is provided between each of the insulator films 21, 25, and 28 and the silicon layer 11, the amount of the hydrogen to be supplied to the silicon layer 11 can be sufficiently secured. For example, when the density of the insulator film 17 is greater than the density of each of the insulator films 21, 25, and 28, the insulator film 17 can block the diffusion of the hydrogen contained in the insulator films 21, 25, and 28. The same applies particularly to the case where the density of the insulator film 17 is greater than the density of the silicon oxide layers 20 and 24. For example, the density of the insulator film 17 can be 2.200 to 2.250 g/cm$^3$. On the other hand, since the insulator film 17 is located closer to the silicon layer 11 as compared with the insulator films 21, 25, and 28, a possibility that the supply of the hydrogen in the insulator film 17 to the photoelectric conversion region is blocked becomes less than the possibility of the insulator films 21, 25, and 28. Therefore, for the insulator film 17, a silicon oxide film can be adopted in which the hydrogen content is reduced and other aspects, such as damages to the silicon layer 11 and flatness, are regarded as important.

The hydrogen concentration of the dielectric film 31 is preferably greater than the hydrogen concentration of each of the insulator films 17, 21, 25, and 28. Particularly the hydrogen concentration of the dielectric film 31 is preferably greater than the hydrogen concentration of the insulator film 17. The hydrogen concentration of the dielectric film 31 is preferably greater than the hydrogen concentration of the silicon oxide layers 20 and 24.

Method for Manufacturing Photoelectric Conversion Device

An example of a method for manufacturing a photoelectric conversion device is described with reference to FIGS. 2A to 4C. FIGS. 2A to 4C correspond to the cross-sectional structure illustrated in FIG. 1B.

In the following description, although a description is given focusing on the principal portion of a method for manufacturing an electroconductive member for simplification, portions which are not described are formed by usual methods for manufacturing solid state image pickup elements.

Figure 2A:
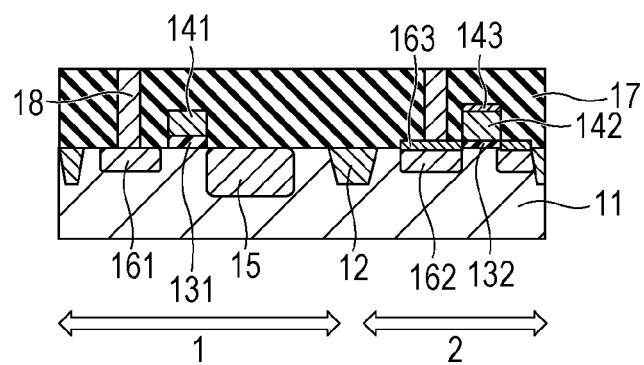
FIGS. 2A to 2D are schematic views explaining an example of a method for manufacturing a photoelectric conversion device.

First, as illustrated in FIG. 2A, element isolation portions 12 are formed in the silicon layer 11 of a wafer to define element portions by the element isolation portions 12. The element isolation portion 12 may have a LOCOS structure but has a STI structure in this example. The gate insulating films 131 and 132 are formed on the silicon layer 11 of the element portions. The gate electrodes 141 and 142 are formed on the gate insulating films 131 and 132. Then, the photoelectric conversion region 15, the impurity region 161, and the source/drain region 162 are formed corresponding to the gate electrodes 141 and 142.

Subsequently, the insulator film 17 is formed on the silicon layer 11. The insulator film 17 is a silicon oxide film, for example, and can be silicate glass containing at least either boron or phosphorus. The typical insulator film 17 is a boro-phospho silicate glass (BPSG) film. The insulator film 17 can be formed by a plasma chemical vapor deposition (CVD) method. For the film formation of the insulator film 17, a high density plasma CVD method (High Density Plasma (HDP)-CVD) is suitable. The plasma density in the high density plasma CVD method can be $10^{11}$ to $10^{13}/cm^3$, for example. For the raw material gas of the insulator film 17, silane-based gas can be used. The film formation temperature in the film formation of the insulator film 17 can be set to 400 to 450° C. The insulator film 17 is subjected to planarization processing, such as a reflow method, a chemical mechanical polishing (CMP) method, or an etch-back method. The planarization processing may be performed alone or in combination of two or more kinds thereof. In the insulator film 17, contact holes which reach the impurity region 161 and the source/drain region 162 are opened. In the contact holes, the contact plugs 18 are formed.

Next, the electroconductive members 19 are formed. First, a titanium layer having a thickness of about 5 nm and a titanium nitride layer having a thickness of about 20 nm, for example, are successively formed on the insulator film 17 by a sputtering method, for example, to form a barrier metal layer 1910 in which the titanium layer and the titanium nitride layer are successively laminated, for example.

Subsequently, on the barrier metal layer 1910, a 200 to 300 nm thick aluminum layer is formed at a film formation temperature of 250 to 350° C. to form an electroconductive layer 1920 forming the electroconductive portion 192 of the electroconductive member 19. The aluminum layer can be formed from an AlCu alloy containing about 0.1 to about 1.0 wt % of Cu by a sputtering method.

Subsequently, a titanium layer having a thickness of about 3 nm and a titanium nitride layer having a thickness of about 10 to 50 nm, for example, are successively formed on the electroconductive layer 1920 by a sputtering method, for example, to form a barrier metal layer 1930 in which the titanium layer and the titanium nitride layer are successively laminated, for example.

Thus, on the insulator film 17, the conductor film 190 which has the barrier metal layer 1910, the electroconductive layer 1920, and the barrier metal layer 1930 and which is processed into the electroconductive members 19 is formed. The conductor film 190 can have a thickness of 200 to 500 nm.

Next, the silicon oxide film 200 is formed on the conductor film 190 by a plasma chemical vapor deposition (CVD) method. The silicon oxide film 200 can be formed by reacting tetraethyl orthosilicate (TEOS, $Si(OC_2H_5)_4$) and $O_2$ in a plasma state at a film formation temperature of about 350 to 450° C., for example. The density of the silicon oxide film 200 is preferably made less than the density of the insulator film 17. Thus, the stress in the film formation of the silicon oxide film 200 can be adjusted to be less than the stress in the film formation of the insulator film 17. The silicon oxide film 200 can contact the barrier metal layer 1930. The silicon oxide film 200 in the film formation has a thickness of 100 nm to 200 nm, for example. The silicon oxide film 200 is preferably formed to be thinner than the conductor film 190.

Figure 2B:
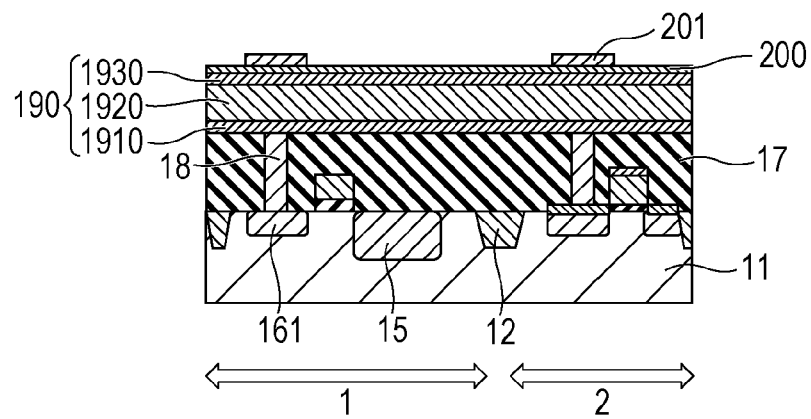

Next, a photoresist is patterned to form a resist pattern 201 on the silicon oxide film 200 by photolithography as illustrated in FIG. 2B.

Figure 2C:
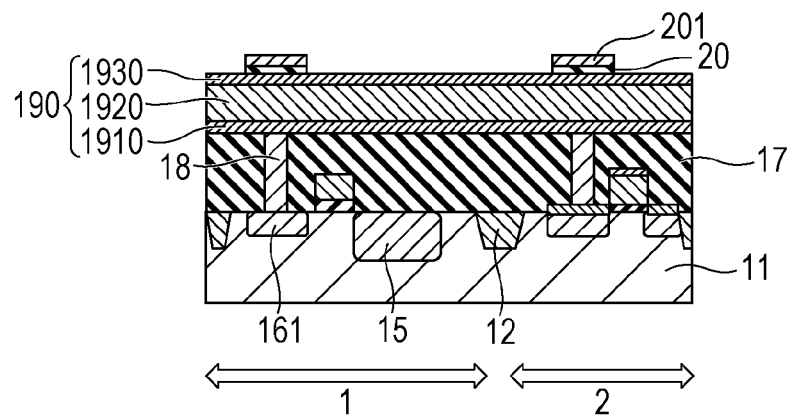

Next, the silicon oxide film 200 is etched using the resist pattern 201 on the silicon oxide film 200 as a mask to pattern the silicon oxide film 200 as illustrated in FIG. 2C. Thus, the patterned silicon oxide layers 20 containing a part of the silicon oxide film 200 are formed. As the etching method, wet etching may be acceptable but dry etching is preferable and reactive ion etching is suitable. For process gas of the dry etching gas, carbon fluoride-based gas which can be selected from at least one of $CF_4$, $CHF_3$, and $C_4F_8$ can be used, for example.

Figure 2D:
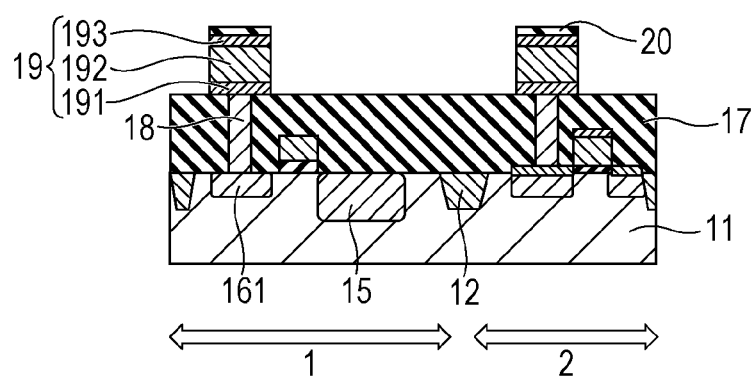

Next, after the formation of the silicon oxide layers 20, the resist pattern 201 used as a mask is removed using an ashing method as illustrated in FIG. 2D.

Next, the conductor film 190 is etched in the order of the barrier metal layer 1930, the electroconductive layer 1920, and the barrier metal layer 1910 using the silicon oxide layers 20 as a mask to pattern the conductor film 190. Thus, the patterned electroconductive members 19 each containing a part of the conductor film 190 are formed. The electroconductive members 19 each have the barrier metal portion 193 containing a part of the barrier metal layer 1930, the electroconductive portion 192 containing a part of the electroconductive layer 1920, and the barrier metal portion 191 containing a part of the barrier metal layer 1910. As the etching method of the conductor film 190, wet etching may be acceptable but dry etching is preferable and reactive ion etching is suitable. For process gas of dry etching, chlorine-based gas can be used, for example.

In this process, the selection ratio of the silicon oxide layer 20 and each layer configuring the conductor film 190 is sufficiently secured. Therefore, the silicon oxide layer 20 is hardly etched and the electroconductive members 19 having a fine line width can be formed. The minimum line width of the electroconductive member 27 can be set to about 150 to 200 nm, for example.

The orientation of the titanium nitride layer in the barrier metal portion 191 under an AlCu alloy layer configuring the electroconductive portion 192 of the electroconductive member 19 may be increased in the <111> direction in such a manner as to increase the orientation of the AlCu alloy in the <111> direction. Thus, the wiring reliability of the electroconductive members 19 having the AlCu alloy can be improved.

Figure 3A:
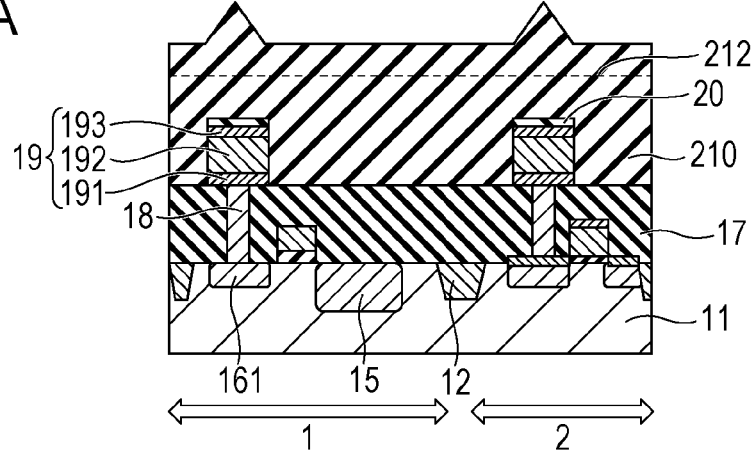
FIGS. 3A to 3C are schematic views explaining the example of the method for manufacturing a photoelectric conversion device.

Next, a silicon oxide film 210 is formed by a plasma chemical vapor deposition (CVD) method on the insulator film 17 on which the electroconductive members 19 are formed as illustrated in FIG. 3A. The silicon oxide film 200 can be formed by reacting silane-based gas and O in a plasma state at a film formation temperature of about 300 to 400° C., for example. As the silane-based gas, silane ($SiH_4$), disilane ($Si_2H_6$), dichlorosilane (Cl2SiH2), trichlorosilane ($Cl_3SiH$), and the like can be used.

The plasma density in the film formation of the silicon oxide film 210 is preferably greater than the plasma density in the film formation of the silicon oxide film 200. The plasma density in the film formation of the silicon oxide film 210 is preferably 10 or more times and more preferably 100 or more times as high as the plasma density in the film formation of the silicon oxide film 200. For the film formation of the silicon oxide film 210, a high density plasma CVD method (HDP-CVD) is suitable. The plasma density in the high density plasma CVD method can be $10^{11}$ to $10^{13}/cm^3$, for example. Under practical film formation conditions, when the plasma density is greater, the hydrogen concentration of the silicon oxide film 210 can be further increased. Under practical film formation conditions, when the plasma density is greater, the density of the silicon oxide film 210 can be further reduced. When the plasma density is greater, the stress to the silicon oxide film 210 can be further reduced.

The film formation temperature in the film formation of the silicon oxide film 210 is preferably made less than the film formation temperature in the film formation of the silicon oxide film 200. The film formation temperature in the film formation of the silicon oxide film 210 is preferably made less than the film formation temperature in the film formation of the insulator film 17. Even when both the silicon oxide film 210 and the insulator film 17 (silicon oxide film) are formed by a high density plasma CVD method, the hydrogen concentration, the density, and the stress can be varied by adjusting the film formation temperature. Under practical film formation conditions, when the film formation temperature is less, the hydrogen concentration of the silicon oxide film 210 can be increased. Under practical film formation conditions, when the film formation temperature is less, the density of the silicon oxide film 210 can be further reduced. When the film formation temperature is less, the stress to the silicon oxide film 210 can be further reduced. When the density is less, the stress to the silicon oxide film 210 can be further reduced. The stress in the film formation of the silicon oxide film 210 can be made less than the stress in the film formation of the silicon oxide film 200. By reducing the stress to the silicon oxide film 210 to be low, damages to the electroconductive members 19 can be reduced. The hydrogen concentration in the film formation of the silicon oxide film 210 can be made greater than the hydrogen concentration in the film formation of the silicon oxide film 200. The hydrogen concentration in the film formation of the silicon oxide film 210 can be made greater than the hydrogen concentration in the film formation of the insulator film 17. Thus, the hydrogen supply amount from the insulator film 21 formed with the silicon oxide film 200 to the silicon layer 11 can be increased. The density in the film formation of the silicon oxide film 210 can be made less than the density in the film formation of the silicon oxide film 200. The density in the film formation of the silicon oxide film 210 can be made less than the density in the film formation of the insulator film 17. Thus, the transmission amount of the hydrogen which is diffused from the top of the insulator film 21 formed from the silicon oxide film 210 can be increased.

The silicon oxide film 210 can contact the insulator film 17, the side surfaces of the electroconductive members 19, and the silicon oxide layer 20. The silicon oxide film 210 in the film formation has a thickness of 200 nm to 2000 nm, for example. The silicon oxide film 210 is preferably formed to be thicker than the silicon oxide film 200. The insulator film 21 described above is formed from the silicon oxide film 210. FIG. 3E shows the position of the top surface of the insulator film 21 by a line 212. The silicon oxide film 210 can be formed to have a thickness larger than the thickness of the final insulator film 21. Since the underground of the silicon oxide film 210 has convex portions configured by the electroconductive members 19 and the silicon oxide layer 20, the silicon oxide film 210 can have projection portions above the electroconductive members 19 and the silicon oxide layer 20. The height difference of the projection portions tends to be larger when the plasma density in the plasma CVD method in the film formation of the silicon oxide film 210 is greater. The silicon oxide film 210 can be formed on the insulator film 17 covering the electroconductive members 19 and the silicon oxide layer 20 with the silicon oxide layer 20 on each of the electroconductive members 19 being left thereon. By removing the silicon oxide layer 20 before forming the silicon oxide film 210, the height difference of the projection portions can also be reduced.

Figure 3B:
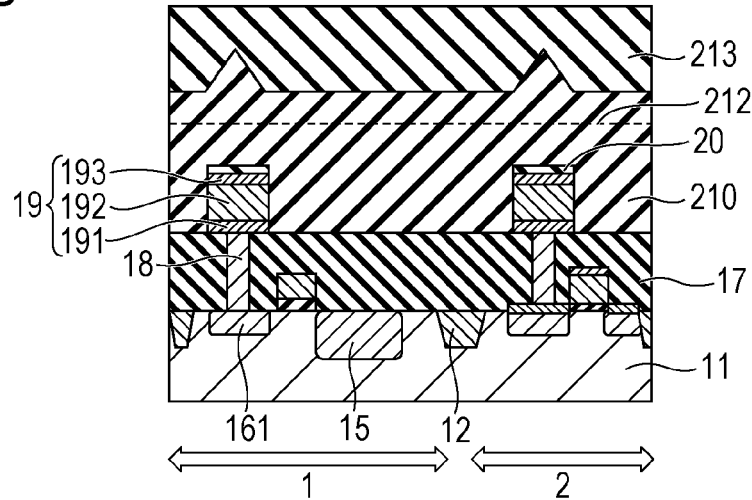

Next, a silicon oxide film 213 is formed on the silicon oxide film 210 as illustrated in FIG. 3B. The top surface of the silicon oxide film 213 has a height difference smaller than the height difference of the projection portions of the silicon oxide film 210. More specifically, the silicon oxide film 213 functions as a planarizing film to the silicon oxide film 210 having the projection portions on the top surface. The silicon oxide film can be formed by a plasma chemical vapor deposition (CVD) method. The silicon oxide film 213 can be formed by reacting tetraethyl orthosilicate (TEOS, $Si(OC_2H_5)_4$) and $O_2$ in a plasma state at a film formation temperature of about 350 to 450° C., for example. The silicon oxide film 213 in the film formation has a thickness of 100 nm to 500 nm, for example. The silicon oxide film 213 can be formed in such a manner as to have a thickness larger than the height of the projection portions of the silicon oxide film 210. The silicon oxide film 213 can be formed to have a thickness smaller than the thickness of the entire silicon oxide film 210.

Figure 3C:
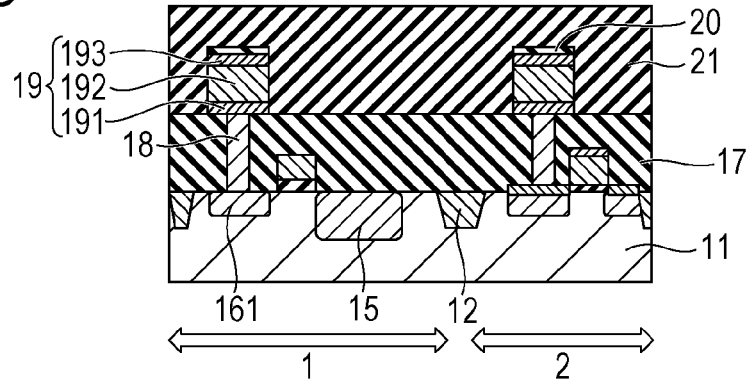

Next, the silicon oxide film 213 and the silicon oxide film 210 are planarized as illustrated in FIG. 3C. The silicon oxide film 213 and the silicon oxide film 210 are subjected to planarization processing, such as a chemical mechanical polishing (CMP) method, an etch-back method, or the like. Thus, the insulator film 21 is formed which is a part of the silicon oxide film 210 and has the planarized top surface. The planarization is carried out in such a manner that a portion overlapped with the photoelectric conversion region 15 of the silicon oxide film 213 disappears from the top of the silicon oxide film 210. In other words, the planarization is carried out in such a manner that the portion overlapped with the photoelectric conversion region 15 of the silicon oxide film 213 does not remain on the silicon oxide film 210. When the planarization is carried out to the line 212 illustrated in FIG. 3B, the silicon oxide film 213 disappears. The thickness of the portions located on the electroconductive members 19 after the planarization of the insulator film 21 is 300 to 600 nm, for example, and can be made larger than the thickness of the electroconductive members 19. The thickness of the portion overlapped with the photoelectric conversion region 15 after the planarization is 500 to 1000 nm.

By covering the projection portions of the silicon oxide film 210 with the silicon oxide film 213, the pressure to be applied to the projection portions when performing the CMP processing to the silicon oxide film 210 can be reduced, so that the occurrence of damages, such as scratches, due to the breakage of the projection portions can be suppressed. By eliminating the silicon oxide film 213, the interface between the silicon oxide film 213 and the silicon oxide film 210 does not remain around the electroconductive members 19, so that a reduction in reliability resulting from the presence of the interface can be suppressed.

Figure 4A:
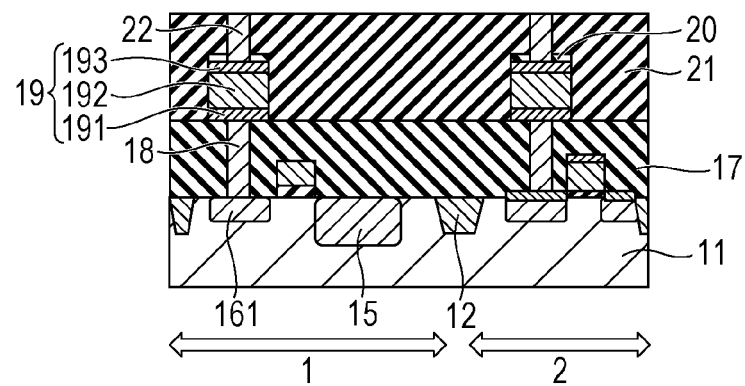
FIGS. 4A to 4C are schematic views explaining the example of the method for manufacturing a photoelectric conversion device.

Next, via holes which reach the electroconductive members 19 are opened in the insulator film 21 and the silicon oxide layer 20 as illustrated in FIG. 4A. Subsequently, a barrier metal layer obtained by successively laminating a titanium layer and a titanium nitride layer is formed by a sputtering method or a CVD method, for example, on the insulator film 21 in which the via holes are formed. Then, an electroconductive layer containing tungsten or the like is formed by a CVD method, for example, and then the via holes are embedded with the electroconductive layer. Subsequently, the barrier metal layer and the electroconductive layer on the insulator film 21 are removed by a CMP method, for example. Thus, the via plugs 22 each having a barrier metal portion containing a part of the barrier metal layer and an electroconductive portion containing a part of the electroconductive layer are formed in the through holes.

Figure 4B:
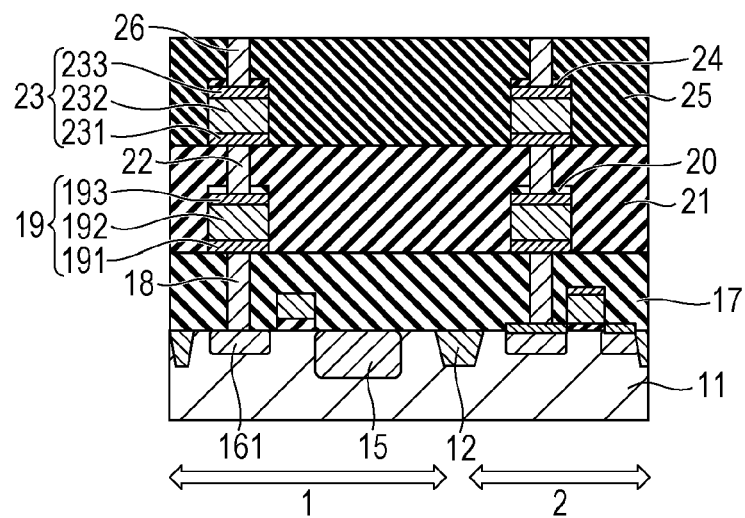

Next, as illustrated in FIG. 4B, the electroconductive members 23 are formed on the insulator film 21 in the same manner as in the case of the electroconductive members 19. The electroconductive member 23 can be formed by patterning by dry etching of the conductor film using the silicon oxide layer 24 as a mask in the same manner as in the case of the electroconductive members 19.

Furthermore, the insulator film 25 is formed on the insulator film 21 on which the electroconductive members 23 are formed. A method for forming the insulator film 25 is the same as that of the insulator film 21. For example, the plasma density in the film formation of a silicon oxide film forming the insulator film 25 can be made greater than the plasma density in the film formation of a silicon oxide film forming the silicon oxide layer 24. The silicon oxide film forming the insulator film 25 can be formed by a high density plasma CVD method. The raw material gas in the film formation of the silicon oxide film forming the insulator film 25 can be silane-based gas. The film formation temperature in the film formation of the silicon oxide film forming the insulator film 25 can be made less than the film formation temperature in the film formation of the silicon oxide film forming the silicon oxide layer 24. The stress in the film formation of the silicon oxide film forming the insulator film 25 can be made less than the stress in the film formation of the silicon oxide film forming the silicon oxide layer 24. The hydrogen concentration in the film formation of the silicon oxide film forming the insulator film 25 can be made greater than the hydrogen concentration in the film formation of the silicon oxide film forming the silicon oxide layer 24. The density in the film formation of the silicon oxide film forming the insulator film 25 can be made less than the density in the film formation of the silicon oxide film forming the silicon oxide layer 24. The raw material gas in the film formation of the silicon oxide film forming the insulator film 25 can be silane-based gas. The silicon oxide film forming the insulator film 25 can be formed in such a manner as to cover the silicon oxide layer 20 used as a mask pattern. On the silicon oxide film forming the insulator film 25, a silicon oxide film for planarization can be formed. The raw material gas in the film formation of the silicon oxide film for the planarization can be TEOS gas. The silicon oxide film for planarization and the silicon oxide film forming the insulator film 25 can be planarized in such a manner that a portion overlapped with the photoelectric conversion region 15 of the silicon oxide film for planarization does not remain on the silicon oxide film forming the insulator film 25. The plasma density in the film formation of the silicon oxide film for planarization can be made less than the plasma density in the film formation of the silicon oxide film forming the insulator film 25.

Next, via holes which reach the electroconductive members 23 are formed in the insulator film 25 and the silicon oxide layer 24. Subsequently, the via plugs 22 are formed in the via holes.

Figure 4C:
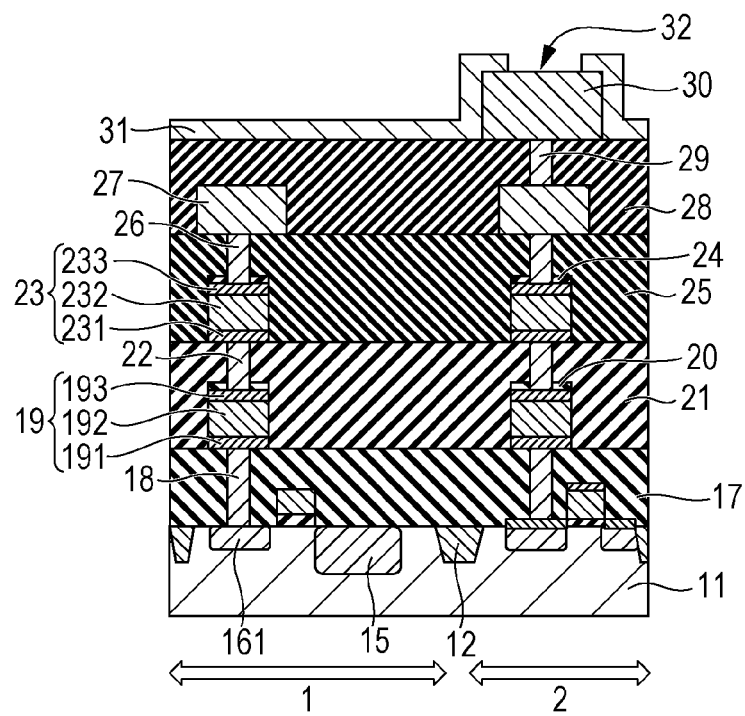

Next, the electroconductive members 27 are formed as illustrated in FIG. 4C. The electroconductive members 27 can be formed by patterning a conductor film which is formed on the insulator film 25 and has a barrier metal layer and an electroconductive layer using a resist pattern as a mask. In this process, it is not necessary to use a mask pattern containing a silicon compound of a silicon oxide layer or a silicon nitride layer as a mask. The minimum line width of the electroconductive member 27 can be set to about 250 to 300 nm.

Furthermore, the insulator film 28 is formed on the electroconductive member 27. Since a mask pattern (hard mask) containing a silicon compound is not used for the formation of the electroconductive members 27, the insulator film 28 can contact the top surfaces of the electroconductive members 27.

Next, a via hole which reaches the electroconductive member 27 is formed in the insulator film 25 in the peripheral portion 2. Subsequently, the via plug 29 is formed in the via hole.

On the insulator film 28, the electroconductive member 30 to be connected to the via plug 29 is formed. The electroconductive member 30 can be formed by patterning a conductor film formed on the insulator film 25 and having a barrier metal layer and an electroconductive layer using a resist pattern as a mask. In this process, it is not necessary to use a mask pattern (hard mask) containing a silicon compound of a silicon oxide layer or a silicon nitride layer as a mask. The minimum line width of the electroconductive member 30 can be set to about 500 to 1000 nm, for example.

Next, the dielectric film 31 is formed in such a manner as to cover the insulator film 28 and the electroconductive member 30. The dielectric film 31 can be formed as a multilayer film containing a silicon nitride layer and a silicon oxynitride layer. An opening 32 is formed on the electroconductive member 30 which functions as a bonding pad of the dielectric film 31. In the formation of the opening 32, the silicon nitride layer of the dielectric film 31 is etched using a photoresist mask pattern as a mask. As the etching method, reactive ion etching using $CF_4$-based process gas can be adopted, for example.

On the dielectric film 31, a color filter layer, a planarization layer, and a microlens layer are successively formed, and then an opening overlapped with the opening 32 is formed in the microlens layer and the planarization layer to expose the electroconductive member 30 which finally functions as a bonding pad.

Next, heat treatment at about 300 to 500° C. is performed. The heat treatment temperature is preferably 400° C. or greater. Hydrogen contained in the dielectric film 31 and the insulator films 17, 21, 25, and 28 is diffused to be supplied to the silicon layer 11 by the heat treatment. Thus, the dangling bond of the silicon layer 11 is terminated with the hydrogen, so that the interface state can be lowered. As a result, noises generated in the silicon layer 11 can be reduced. The noises which are reduced by the hydrogen termination are dark current and random noise.

Then, the wafer is diced to be divided into a plurality of photoelectric conversion devices IC. The photoelectric conversion devices IC are mounted a package PKG (die bonding), and then the terminal of the package PKG and the bonding pads of the photoelectric conversion devices IC are connected through the opening 32 (wire bonding). The photoelectric conversions IC are sealed with a transparent lid body to complete a photoelectric conversion device. The photoelectric conversion device is mounted on a circuit substrate, and then the circuit substrate is connected to a circuit substrate on which a signal-processing device, a display device, and the like are mounted, whereby an image pickup system SYS can be obtained.

Modification

Hereinafter, modifications of the photoelectric conversion device are described.

Figure 5A:
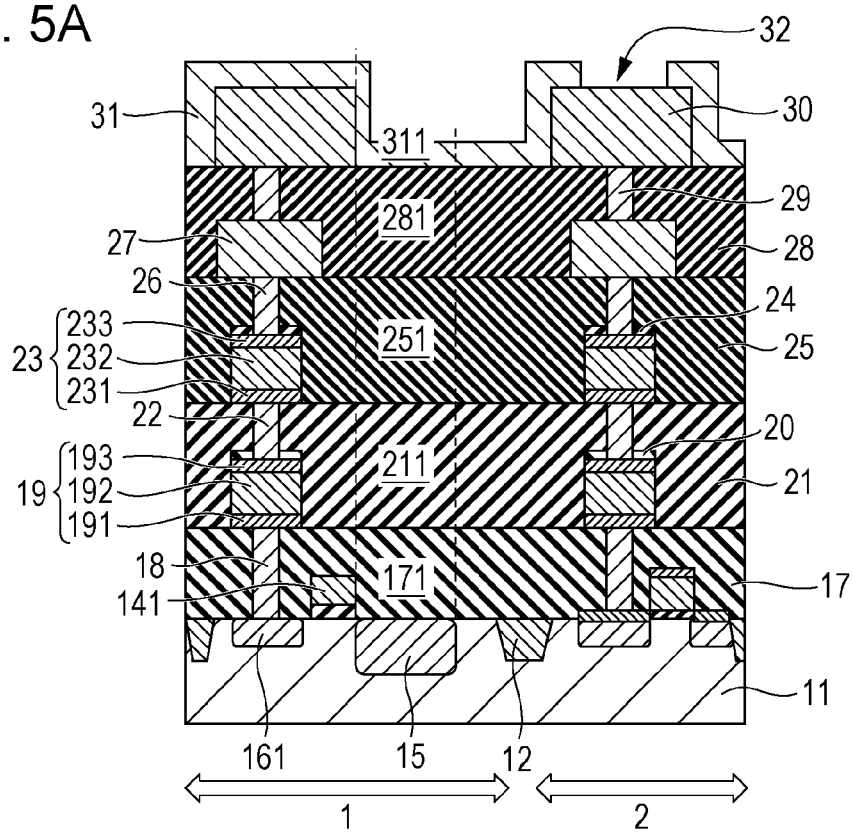
FIGS. 5A and 5B are schematic views explaining examples of a photoelectric conversion device.

FIG. 5A is different from the aspect of FIG. 1B in that the electroconductive member 30 is disposed on the insulator film 28 in the pixel portion 1. In the pixel portion 1, the electroconductive member 30 can function as a light shielding member and the electroconductive member 27 can function as a wiring member. Since the number of the wiring member is increased as compared with that in the aspect of FIG. 1B, the functionality of a pixel circuit can be enhanced.

Figure 5B:
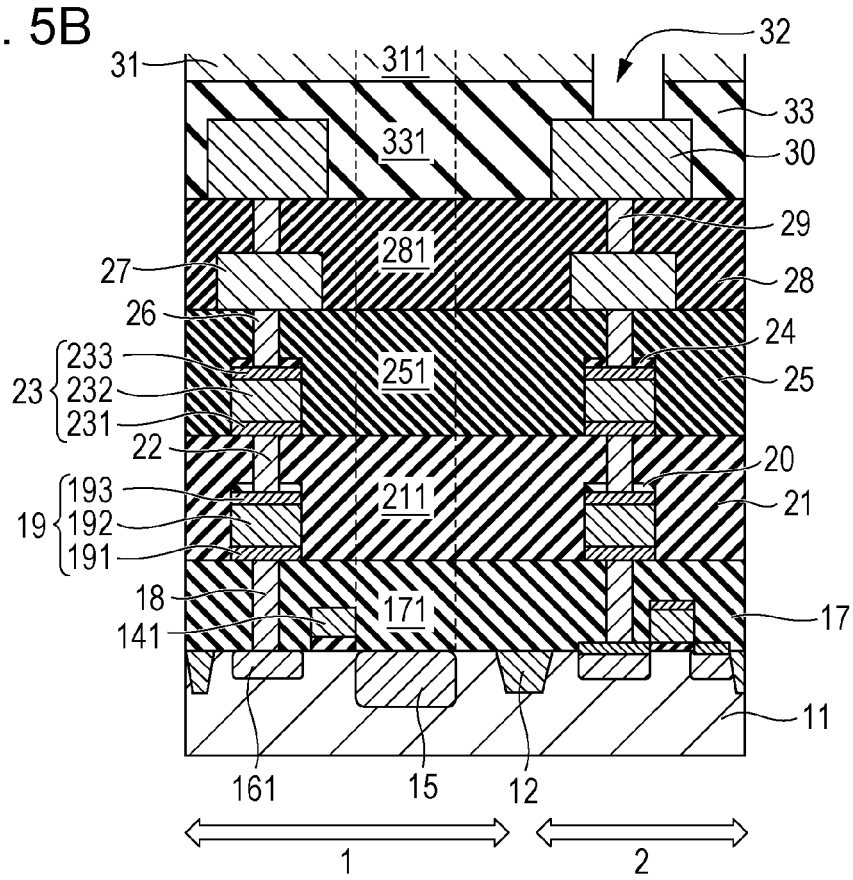

FIG. 5B is different from the aspect of FIG. 5A in that an insulator film 33 is disposed between the electroconductive member 30 and the dielectric film 31 in the pixel portion 1. The insulator film 33 functions as a planarizing film. Since the dielectric film 31 is planarized along the flat top surface of the insulator film 33, the light utilization efficiency can be improved. The insulator film 33 is a silicon oxide film and can be formed in such a manner as to abundantly contain hydrogen by forming the same by a HDPCVD method in which the film formation temperature is set to 300 to 400° C.

Figure 6A:
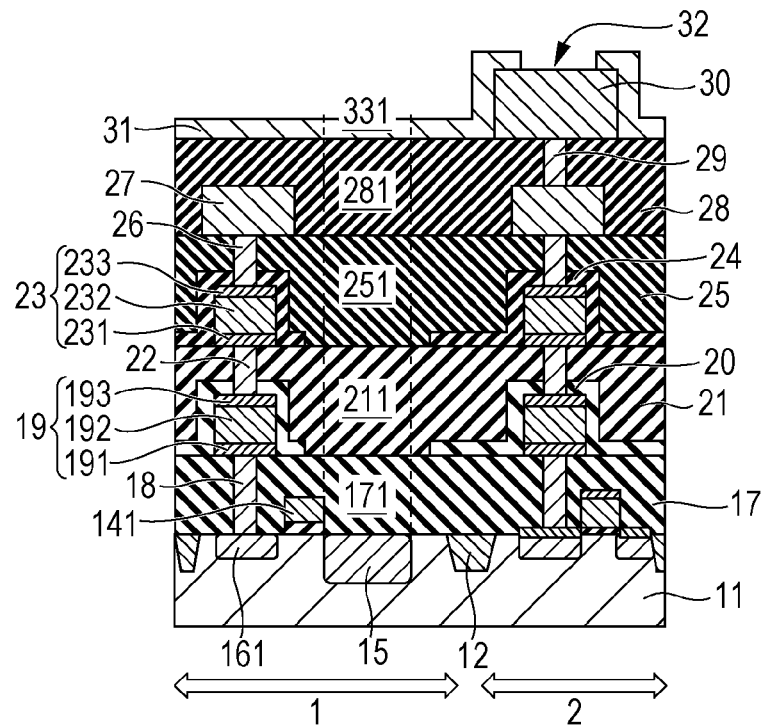
FIGS. 6A and 6B are schematic views explaining examples of a photoelectric conversion device.

FIG. 6A is different from the aspect of FIG. 1A in that the silicon oxide layer 20 contacts the side surfaces of the electroconductive members 19. The silicon oxide layer 20 is not formed as a mask pattern when forming the electroconductive members 19 but is formed in such a manner as to cover the electroconductive members 19 after forming the electroconductive member 19 and before forming the insulator film 21. The overlapped portion 211 of the insulator film 21 is in contact with the overlapped portion 171 of the lower-layer insulator film 17. Therefore, after forming a silicon oxide film forming the silicon oxide layer 20, a portion which contacts the overlapped portion 171 of the silicon oxide film is removed. Moreover, the overlapped portion 211 of the insulator film 21 is in contact with the overlapped portion 251 of the upper-layer insulator film 25. Therefore, after forming a silicon oxide film forming the silicon oxide layer 24, a portion which contacts the overlapped portion 251 of the silicon oxide film is removed. Thus, due to the fact that the silicon oxide layers 20 and 24 are disposed, the blocking of the diffusion to the silicon layer 11 of the hydrogen contained in the insulator films 21, 25, and 28 by the silicon oxide layers 20 and 24 having a density greater than the density of the films can be suppressed.

Figure 6B:
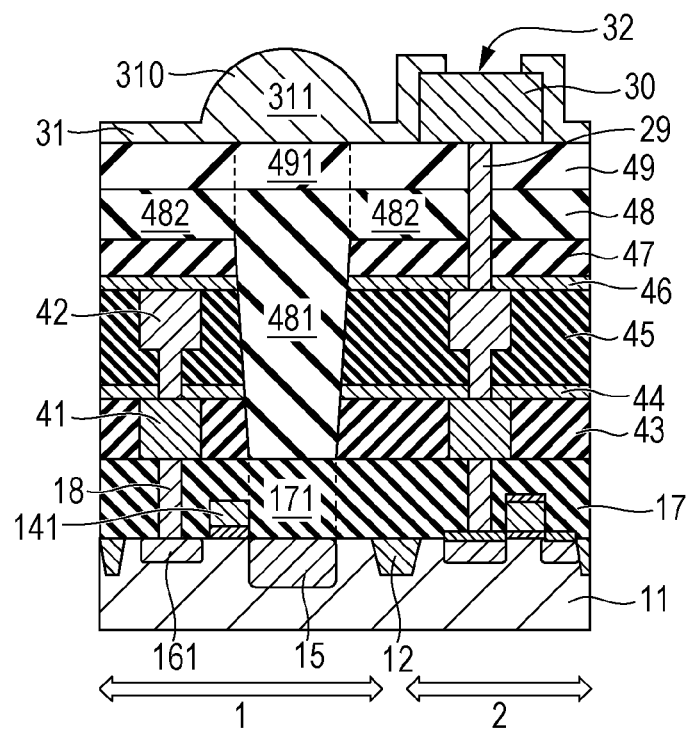

FIG. 6B is different from other embodiments in that electroconductive members 41 and 42 are used. The electroconductive members 41 have a single damascene structure in which the electroconductive members 41 are embedded in the silicon oxide layer 43. The electroconductive members 42 have a dual damascene structure in which the electroconductive members 42 are embedded in the silicon oxide layer 45. The undersurfaces and the side surfaces of the electroconductive members 41 and 42 can be configured by barrier metal portions having a tantalum layer and/or a tantalum nitride layer and the top surfaces of the electroconductive members 41 and 42 can be configured by electroconductive portions containing copper as the main component.

Between the silicon oxide layer 43 and the silicon oxide layer 45, a diffusion prevention layer 44 contacting the top surfaces of the electroconductive members 41 is disposed. Between the silicon oxide layer 45 and the silicon oxide layer 47, a diffusion prevention layer 46 contacting the top surfaces of the electroconductive members 42 is disposed.

The silicon oxide layers 43, 45, and 47 can be silicon oxide layers. The diffusion prevention layers 44 and 46 can be silicon carbide layers or silicon nitride layers. The diffusion prevention layers 44 and 46 block the diffusion of copper from the electroconductive members 41 and 42 to the silicon oxide layers 43, 45, and 47. On the silicon oxide layer 47, a silicon oxide film 48 is provided. The silicon oxide film 48 has an overlapped portion 481 which is a portion overlapped with the photoelectric conversion region 15. The overlapped portion 481 penetrates through the silicon oxide layers 43, 45, and 47 and the diffusion prevention layers 44 and 46 to contact the overlapped portion 171 of the insulator film 17. The electroconductive members 41 and 42 are located between extended portions 482 extended from the overlapped portion 481 of the silicon oxide film 48 and the insulator film 17. The silicon oxide layers 45 and 47 are located between the electroconductive members 41 and the extended portions 482 of the silicon oxide film 48. The silicon oxide layer 47 is located between the electroconductive members 42 and the extended portions 482 of the silicon oxide film 48.

On the silicon oxide film 48, an insulator film 49 which is a silicon oxide film is disposed. The insulator film 49 can be a silicon oxide film containing hydrogen. The insulator film 49 has an overlapped portion 491 which is a portion overlapped with the photoelectric conversion region 15. On the insulator film 49, the dielectric film 31 having a silicon nitride layer and containing hydrogen is provided. In this example, the overlapped portion 311 which is a portion overlapped with the photoelectric conversion region 15 of the dielectric film 31 has a lens portion 310. The dielectric film 31 can function as a passivation film.

The hydrogen concentration of the silicon oxide film 48 is preferably greater than the hydrogen concentrations of the silicon oxide layers 43, 45, and 47. Thus, abundant hydrogen contained in the silicon oxide film 48 can be supplied to the photoelectric conversion region 15. The density of the silicon oxide film 48 is preferably less than the densities of the silicon oxide layers 43, 45, and 47. The density of the silicon oxide film 48 is preferably less than the densities of the diffusion prevention layers 44 and 46. Thus, the overlapped portion 481 of the silicon oxide film 48 can transmit the hydrogen contained in the overlapped portions 491 and 311 to the photoelectric conversion region 15. The overlapped portion 481 of the silicon oxide film 48 penetrates through the silicon oxide layers 43, 45, and 47 and the diffusion prevention layers 44 and 46 which have density greater than the density of the silicon oxide film 48 and thus are difficult to transmit hydrogen. Thus, the blocking of the diffusion of hydrogen by the silicon oxide layers 43, 45, and 47 and the diffusion prevention layers 44 and 46 can be suppressed.

The silicon oxide film 48 and the silicon oxide layers 43, 45, and 47 can be formed by a plasma CVD method. The plasma density in the film formation of the silicon oxide film 48 can be made greater than the plasma density in the film formation of the silicon oxide film forming the silicon oxide layers 43, 45, and 47. The silicon oxide film 48 can be formed by a high density plasma CVD method. The silicon oxide film forming the silicon oxide layers 43, 45, and 47 can also be formed by a high density plasma CVD method.

The film formation temperature in the film formation of the silicon oxide film 48 can be made less than the film formation temperature in the film formation of the silicon oxide film forming the silicon oxide layers 43, 45, and 47. The silicon oxide film 48 can be formed by a high density plasma CVD method in which the film formation temperature is set to low temperatures of 300 to 400° C. The silicon oxide film 48 can be formed by a high density plasma CVD method in which the film formation temperature is set to high temperatures of 350 to 450° C. The stress in the film formation of the silicon oxide film 48 can be made less than the stress in the film formation of the silicon oxide film forming the silicon oxide layers 43, 45, and 47. For the raw material gas in the film formation of the silicon oxide film forming the silicon oxide layers 43, 45, and 47, TEOS gas can be used. For the raw material gas in the film formation of the silicon oxide film 48, TEOS gas or silane-based gas can be used. When forming the silicon oxide film 48 by a high density plasma CVD method, silane-based gas is preferably used for the raw material gas in the film formation.

The present technique can provide a photoelectric conversion device with reduced noise.

The embodiments described above can be altered as appropriate without deviating from the idea of the present technique.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-109425, filed May 29, 2015, which is hereby incorporated by reference herein in its entirety.

What is claimed is:

1. A photoelectric conversion device, comprising:
an insulator film disposed on a silicon layer having a photoelectric conversion region, the insulator film having a portion overlapped with the photoelectric conversion region;
a silicon oxide film disposed on the insulator film, the silicon oxide film having a portion overlapped with the photoelectric conversion region;
an electroconductive member disposed between the insulator film and the silicon oxide film; and
a silicon oxide layer disposed between the electroconductive member and the silicon oxide film, wherein
the portion overlapped with the photoelectric conversion region of the silicon oxide film is in contact with the portion overlapped with the photoelectric conversion region of the insulator film, and
a hydrogen concentration of the silicon oxide film is greater than a hydrogen concentration of the silicon oxide layer.

2. The photoelectric conversion device according to claim 1, wherein
the silicon oxide layer contacts a top surface of the electroconductive member.

3. The photoelectric conversion device according to claim 1, wherein
the electroconductive member has an electroconductive portion and a barrier metal portion, and
the silicon oxide layer does not contact a side surface of the electroconductive portion of the electroconductive member.

4. The photoelectric conversion device according to claim 1, wherein
the electroconductive member contains a titanium layer.

5. The photoelectric conversion device according to claim 1, wherein
the hydrogen concentration of the silicon oxide film is greater than a hydrogen concentration of the insulator film.

6. The photoelectric conversion device according to claim 1, wherein
a density of the insulator film is greater than a density of the silicon oxide film.

7. An image pickup system comprising:
the photoelectric conversion device according to claim 1; and
at least any one of an optical unit forming an image on the photoelectric conversion device, a control unit controlling the photoelectric conversion device, a processing unit processing a signal obtained from the photoelectric conversion device, a display unit displaying an image obtained from the photoelectric conversion device, and a memory unit storing an image obtained from the photoelectric conversion device.

8. A photoelectric conversion device comprising:
a first insulator film disposed on a silicon layer having a photoelectric conversion region, the first insulator film having a portion overlapped with the photoelectric conversion region;
a silicon oxide film disposed on the first insulator film, the silicon oxide film having a portion overlapped with the photoelectric conversion region;
an electroconductive member disposed between the first insulator film and the silicon oxide film;
a silicon oxide layer disposed between the electroconductive member and the silicon oxide film; and
a second insulator film disposed on the silicon oxide film, the second insulator film having a portion overlapped with the photoelectric conversion region and containing hydrogen, wherein
the portion overlapped with the photoelectric conversion region of the silicon oxide film is in contact with the portion overlapped with the photoelectric conversion region of the first insulator film and in contact with the portion overlapped with the photoelectric conversion region of the second insulator film, and
a density of the silicon oxide film is greater than a density of the silicon oxide layer.

9. The photoelectric conversion device according to claim 8, further comprising a second electroconductive member disposed between the second insulator film and the silicon oxide film with the electroconductive member disposed between the first insulator film and the silicon oxide film as a first electroconductive member, wherein
a top surface of the second electroconductive member is in contact with the second insulator film.

10. The photoelectric conversion device according to claim 8, wherein
a dielectric film containing hydrogen is disposed on the second insulator film, and
a density of the second insulator film is less than a density of the silicon oxide layer and a density of the dielectric film.

11. The photoelectric conversion device according to claim 8, wherein
the silicon oxide layer contacts a top surface of the electroconductive member.

12. The photoelectric conversion device according to claim 8, wherein the electroconductive member has an electroconductive portion and a barrier metal portion, and the silicon oxide layer does not contact a side surface of the electroconductive portion of the electroconductive member.

13. The photoelectric conversion device according to claim 8, wherein the electroconductive member contains a titanium layer.

14. An image pickup system comprising:

the photoelectric conversion device according to claim 8; and at least any one of an optical unit forming an image on the photoelectric conversion device, a control unit controlling the photoelectric conversion device, a processing unit processing a signal obtained from the photoelectric conversion device, a display unit displaying an image obtained from the photoelectric conversion device, and a memory unit storing an image obtained from the photoelectric conversion device.

\* \* \* \* \*